(12) United States Patent
Marsh et al.

(10) Patent No.: US 10,153,431 B2
(45) Date of Patent: Dec. 11, 2018

(54) RESISTIVE MEMORY HAVING CONFINED FILAMENT FORMATION

(71) Applicant: Micron Technology, Inc., Boise, ID (US)

(72) Inventors: Eugene P. Marsh, Boise, ID (US); Jun Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/661,351

(22) Filed: Jul. 27, 2017

(65) Prior Publication Data
US 2017/0324034 A1 Nov. 9, 2017

Related U.S. Application Data

(60) Continuation of application No. 15/206,556, filed on Jul. 11, 2016, now Pat. No. 9,722,178, which is a (Continued)

(51) Int. Cl.
*H01L 45/00* (2006.01)
(52) U.S. Cl.
CPC ............ *H01L 45/085* (2013.01); *H01L 45/08* (2013.01); *H01L 45/124* (2013.01); (Continued)
(58) Field of Classification Search
CPC . H01L 45/085; H01L 45/124; H01L 45/1683; H01L 45/1253; H01L 45/08; H01L 45/143; H01L 45/146; H01L 45/147; H01L 45/14; H01L 45/1246; H01L 45/1233; H01L 45/16; H01L 45/1266
See application file for complete search history.

(56) References Cited

U.S. PATENT DOCUMENTS 5,536,947 A 7/1996 Klersy et al.
6,444,539 B1 * 9/2002 Sun ..................... H01L 21/7621
257/E21.549

(Continued)

FOREIGN PATENT DOCUMENTS

CN 1568551 A 1/2005
CN 102244193 A 11/2011
(Continued)

OTHER PUBLICATIONS

Deal et al., "General Relationship for the Thermal Oxidation of Silicon", Sep. 9, 1965, Journal of Applied Physics, vol. 36, No. 12, pp. 3770-3778.*

(Continued)

*Primary Examiner* — Steven Loke
*Assistant Examiner* — Juanita Rhodes
(74) *Attorney, Agent, or Firm* — Brooks, Cameron & Huebsch, PLLC (57) ABSTRACT

Resistive memory having confined filament formation is described herein. One or more method embodiments include forming an opening in a stack having a silicon material and an oxide material on the silicon material, and forming an oxide material in the opening adjacent the silicon material, wherein the oxide material formed in the opening confines filament formation in the resistive memory cell to an area enclosed by the oxide material formed in the opening.

19 Claims, 5 Drawing Sheets

Related U.S. Application Data continuation of application No. 14/478,408, filed on Sep. 5, 2014, now Pat. No. 9,406,880, which is a division of application No. 13/465,166, filed on May 7, 2012, now Pat. No. 8,853,713.

(52) U.S. Cl.
CPC ...... *H01L 45/1233* (2013.01); *H01L 45/1246* (2013.01); *H01L 45/1253* (2013.01); *H01L 45/1266* (2013.01); *H01L 45/14* (2013.01); *H01L 45/143* (2013.01); *H01L 45/146* (2013.01); *H01L 45/147* (2013.01); *H01L 45/16* (2013.01); *H01L 45/1683* (2013.01)

(56) References Cited

U.S. PATENT DOCUMENTS

| | | | |
|---|---|---|---|
| 6,674,115 | B2 | 1/2004 | Hudgens et al. |
| 6,998,289 | B2 | 2/2006 | Hudgens et al. |
| 7,122,854 | B2 | 10/2006 | Fukuzumi |
| 7,547,905 | B2 | 6/2009 | Gilton |
| 7,791,141 | B2 | 9/2010 | Meijer et al. |
| 7,795,606 | B2 | 9/2010 | Jin et al. |
| 7,883,929 | B2 | 2/2011 | Choi et al. |
| 7,960,216 | B2 | 6/2011 | Phatak |
| 8,222,713 | B2 | 7/2012 | Kouchiyama et al. |
| 8,569,732 | B2 | 10/2013 | Yasuda et al. |
| 8,848,421 | B2 | 9/2014 | Kawai et al. |
| 8,873,274 | B2 | 10/2014 | Baek et al. |
| 8,981,325 | B2 | 3/2015 | Aratani et al. |
| 9,023,711 | B2 | 5/2015 | March |
| 2002/0182893 | A1 | 9/2002 | Ballantine et al. |
| 2003/0080427 | A1* | 5/2003 | Hudgens ............ H01L 29/8615 257/748 |
| 2005/0226036 | A1* | 10/2005 | Aratani ............... G11C 13/0011 365/158 |
| 2007/0224757 | A1* | 9/2007 | Cheng ............... H01L 27/10867 438/243 |
| 2007/0235712 | A1 | 10/2007 | Harshfield et al. |
| 2007/0269683 | A1 | 11/2007 | Chen et al. |
| 2008/0017894 | A1 | 1/2008 | Happ et al. |
| 2008/0073635 | A1 | 3/2008 | Kiyotoshi et al. |
| 2008/0138931 | A1* | 6/2008 | Lung ..................... H01L 45/04 438/102 |
| 2008/0173982 | A1 | 7/2008 | Lai et al. |
| 2008/0220601 | A1 | 9/2008 | Kumar et al. |
| 2009/0148981 | A1 | 6/2009 | Lai et al. |
| 2009/0278109 | A1 | 11/2009 | Phatak |
| 2009/0278110 | A1 | 11/2009 | Gorer et al. |
| 2010/0108972 | A1 | 5/2010 | Zhao et al. |
| 2010/0135060 | A1* | 6/2010 | Aratani ............... G11C 13/0011 365/100 |
| 2010/0155687 | A1* | 6/2010 | Reyes .................... H01L 45/04 257/4 |
| 2010/0252798 | A1 | 10/2010 | Sumino |
| 2010/0259962 | A1 | 10/2010 | Yan et al. |
| 2011/0001110 | A1* | 1/2011 | Takahashi ........... H01L 27/2436 257/2 |
| 2011/0006278 | A1 | 1/2011 | Takahashi |
| 2011/0175051 | A1 | 7/2011 | Song et al. |
| 2011/0193044 | A1* | 8/2011 | Sandhu ................ H01L 45/085 257/2 |
| 2011/0220862 | A1 | 9/2011 | Arita et al. |
| 2011/0250729 | A1 | 10/2011 | Lai et al. |

FOREIGN PATENT DOCUMENTS

| | | |
|---|---|---|
| JP | H04171921 A | 6/1992 |
| JP | 1999510317 A | 9/1999 |
| JP | 2004349671 A | 12/2004 |
| JP | 2005197634 A | 7/2005 |
| JP | 2006279042 A | 10/2006 |
| JP | 2007-157942 A | 6/2007 |
| JP | 2008235704 A | 10/2008 |
| JP | 2009164467 A | 7/2009 |
| JP | 2010016075 A | 1/2010 |
| JP | 2010040728 A | 2/2010 |
| JP | 2010147428 A | 7/2010 |
| JP | 2012509576 A | 4/2012 |
| WO | 2009096363 A1 | 8/2009 |
| WO | 2009125777 A1 | 10/2009 |
| WO | 2011142386 A1 | 11/2011 |

OTHER PUBLICATIONS

International Search Report and Written Opinion for related PCT Application No. PCT/US2013/039926, dated Jul. 29, 2013, 11 pp.
Deal, et al., "General Relationship for the Thermal Oxidation of Silicon", Journal of Applied Physics, vol. 36, vol. 12, Dec. 1965.
Lim, et al., "Atomic layer deposition of transition metals", Nature Publishing Group, vol. 2, Nov. 2003, pp. 749-754.
Notice of Reasons for Rejection from related Korean patent application No. 10-2014-7033426, dated Apr. 30, 2015, 11 pp.
Office Action from related Taiwan patent application No. 102116246, dated Jun. 2, 2015, 23 pp.
Notice of Reaspons for Rejection from related Korean patent application No. 10-2014-7033426, dated Nov. 25, 2015, 11 pp.
Notice of Rejection Ground from related Japanese patent application No. 2015-511617, dated Nov. 17, 2015, 6 pp.
Supplementary European Search Report from related European patent application No. 13787159.6, dated Dec. 15, 2015, 9 pp.
Chinese Office Action from related Chinese patent application No. 201380024006.6, dated Jun. 23, 2016, 10 pp.

* cited by examiner

RESISTIVE MEMORY HAVING CONFINED FILAMENT FORMATION

PRIORITY INFORMATION

This application is a Continuation of U.S. application Ser. No. 15/206,556 filed Jul. 11, 2016, which is a Continuation of U.S. application Ser. No. 14/478,408 filed Sep. 5, 2014, now U.S. Pat. No. 9,406,880, which is a Divisional of U.S. application Ser. No. 13/465,166 filed May 7, 2012, now U.S. Pat. No. 8,853,713, the specifications of which are incorporated herein by reference.

TECHNICAL FIELD

The present disclosure relates generally to semiconductor memory devices, methods, and systems, and more particularly, to resistive memory having confined filament formation.

BACKGROUND

Memory devices are typically provided as internal, semiconductor, integrated circuits and/or external removable devices in computers or other electronic devices. There are many different types of memory, including random-access memory (RAM), read only memory (ROM), dynamic random access memory (DRAM), synchronous dynamic random access memory (SDRAM), flash memory, and resistive, e.g., resistance variable, memory, among others. Types of resistive memory include programmable conductor memory, resistive random access memory (RRAM), phase change random access memory (PCRAM), magnetoresistive random access memory (MRAM; also referred to as magnetic random access memory), and conductive-bridging random access memory (CBRAM), among others.

Memory devices such as resistive memory devices may be utilized as non-volatile memory for a wide range of electronic applications in need of high memory densities, high reliability, and low power consumption. Non-volatile memory may be used in, for example, personal computers, portable memory sticks, solid state drives (SSDs), personal digital assistants (PDAs), digital cameras, cellular telephones, portable music players such as MP3 players, movie players, and other electronic devices. Data, such as program code, user data, and/or system data, such as a basic input/output system (BIOS), are typically stored in non-volatile memory devices.

Resistive memory such as RRAM includes resistive memory cells that can store data based on the resistance state of a storage element, e.g., a resistive memory element having a variable resistance. As such, resistive memory cells can be programmed to store data corresponding to a target data state by varying the resistance level of the resistive memory element. Resistive memory cells can be programmed to a target data state, e.g., corresponding to a particular resistance state, by applying sources of an electrical field or energy, such as positive or negative electrical pulses, to the cells, e.g., to the resistive memory element of the cells, for a particular duration. The electrical pulses can be, for example, positive or negative voltage or current pulses.

One of a number of data states, e.g., resistance states, can be set for a resistive memory cell. For example, a single level cell (SLC) may be programmed to one of two data states, e.g., logic 1 or 0, which can depend on whether the cell is programmed to a resistance above or below a particular level. As an additional example, various resistive memory cells can be programmed to one of multiple different resistance states corresponding to multiple data states. Such cells may be referred to as multi state cells, multi-digit cells, and/or multilevel cells (MLCs), and can represent multiple binary digits of data (e.g., 10, 01, 00, 11, 111, 101, 100, 1010, 1111, 0101, 0001, etc.).

Resistive memory cells such as RRAM cells may include conductive filament formed therein. The conductive filament can serve as a resistive switching element for the cell, e.g., of the resistive memory element of the cell.

DETAILED DESCRIPTION

Resistive memory having confined filament formation is described herein. One or more method embodiments include forming an opening in a stack having a silicon material and an oxide material on the silicon material, and forming an oxide material in the opening adjacent the silicon material, wherein the oxide material formed in the opening confines filament formation in the resistive memory cell to an area enclosed by the oxide material formed in the opening.

Resistive memory, e.g., resistive memory cells, in accordance with one or more embodiments of the present disclosure can have a smaller contact area between the ion source material of the cell and the resistive memory material of the cell. Accordingly, resistive memory, e.g., resistive memory cells, in accordance with one or more embodiments of the present disclosure can have a smaller area in which conductive filament may form than previous resistive memory. That is, resistive memory in accordance with one or more embodiments of the present disclosure can confine filament formation to a smaller area in the resistive memory than previous resistive memory because resistive memory in accordance with one or more embodiments of the present disclosure can have a smaller contact area between the ion source material and the resistive memory material than previous resistive memory. Accordingly, resistive memory in accordance with one or more embodiments of the present disclosure may have a higher switching uniformity and/or lower variability between cells than previous resistive memory, which can increase the performance, consistency, and/or reliability of the resistive memory.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice a number of embodiments of this disclosure, and it is to be understood that other embodiments may be utilized and that process, electrical, or mechanical changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 104 may reference element "04" in FIGS. 1A-1E, and a similar element may be referenced as 204 in FIGS. 2A-2C.

As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present invention, and should not be taken in a limiting sense.

As used herein, "a number of" something can refer to one or more such things. For example, a number of memory cells can refer to one or more memory cells.

Figure 1A:
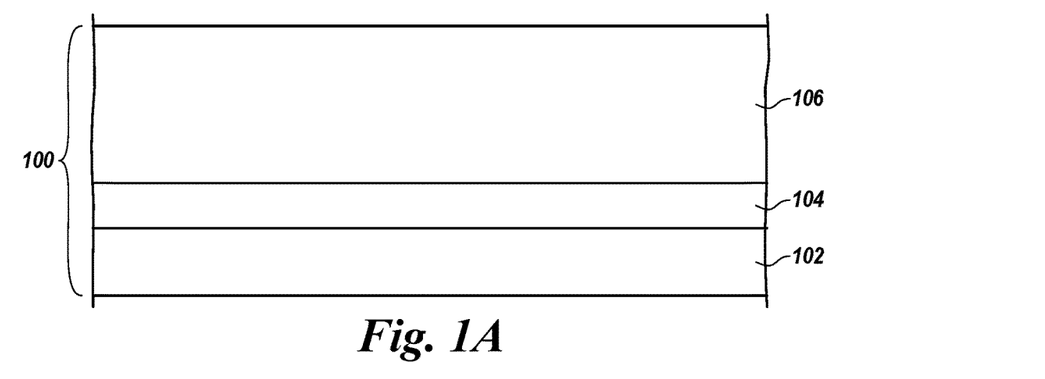
FIGS. 1A-1E illustrate process steps associated with forming a resistive memory cell in accordance with one or more embodiments of the present disclosure.

FIGS. 1A-1E illustrate process steps associated with forming a resistive memory cell in accordance with one or more embodiments of the present disclosure. FIG. 1A illustrates a schematic cross-sectional view of a vertical, e.g., film, stack 100 having a resistive memory material 102, a silicon material 104 on resistive memory material 102, and an oxide material 106 on silicon material 104.

Resistive memory material 102 can be, for example, a resistive random access memory (RRAM) material such as zirconium dioxide ($ZrO_2$) or gadolinium oxide ($GdO_x$). Other RRAM materials can include, for example, colossal magnetoresistive materials such as $Pr_{(1-x)}Ca_xMnO_3$ (PCMO), $La_{(1-x)}CaxMnO_3$ (LCMO), and $Ba_{(1-x)}Sr_xTiO_3$. RRAM materials can also include metal oxides, such as alkaline metal oxides, e.g., $Li_2O$, $Na_2O$, $K_2O$, $Rb_2O$, $Cs_2O$, BeO, MgO, CaO, SrO, and BaO, refractive metal oxides, e.g., NbO, $NbO_2$, $Nb_2O_5$, $MoO_2$, $MoO_3$, $Ta_2O_5$, $W_2O_3$, $WO_2$, $WO_3$, $ReO_2$, $ReO_3$, and $Re_2O_7$, and binary metal oxides, e.g., $Cu_xO_y$, $WO_x$, $Nb_2O_5$, $Al_2O_3$, $Ta_2O_5$, $TiO_x$, $ZrO_x$, $NiO_x$ and $Fe_xO$. RRAM materials can also include $Ge_xSe_y$, and other materials that can support solid phase electrolyte behavior. Other RRAM materials can include perovskite oxides such as doped or undoped $SrTiO_3$, $SrZrO_3$, and $BaTiO_3$, and polymer materials such as Bengala Rose, $AlQ_3Ag$, Cu-TCNQ, DDQ, TAPA, and Fluorescine-based polymers, among other types of RRAM materials. Embodiments of the present disclosure are not limited to a particular type of RRAM material.

Silicon material 104 can be, for example, silicon (Si) or silicon nitride ($Si_3N_4$), among other types of silicon materials. Oxide material 106 can be, for example, an oxide dielectric such as silicon dioxide ($SiO_2$) or zirconium dioxide ($ZrO_2$), among other types of oxide materials. Embodiments of the present disclosure are not limited to a particular type of silicon material or oxide material.

Figure 1B:
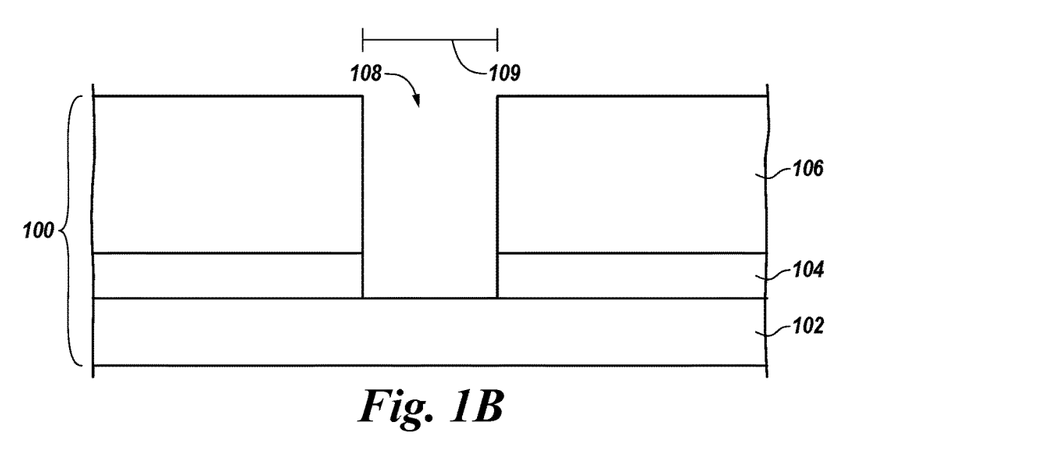

FIG. 1B illustrates a schematic cross-section view of the structure shown in FIG. 1A after a subsequent processing step. A portion of vertical stack 100 is removed, e.g., etched and/or patterned, to form opening 108 in vertical stack 100 shown in FIG. 1B. Opening 108 can be, for example, a trench formed in silicon material 104 and oxide material 106. In the embodiment illustrated in FIG. 1B, the trench is formed all the way through oxide material 106 and silicon material 104, and stops on resistive memory material 102. However, in some embodiments, the trench may extend into resistive memory material 102.

As shown in FIG. 1B, resistive memory material 102, silicon material 104, and oxide material 106 form the boundaries of opening 108. For example, a portion of the top surface of resistive memory material 102 defines the bottom of opening 108, and one or more sides of silicon material 104 and oxide material 106 define the sidewalls of opening 108, as illustrated in FIG. 1B. Although the sidewalls of opening 108 shown in FIG. 1B are parallel, or near parallel, to each other, embodiments of the present disclosure are not so limited. For example, opening 108 can have shapes other than that shown in FIG. 1B.

Opening 108 can have a width 109, e.g., a distance between the sidewalls, of, for example, 30 to 40 nanometers. In some embodiments, the width of opening 108 can be equal to one feature width, e.g., photolithographic dimension.

Opening 108 can be formed in vertical stack 100 in a manner known in the art. For example, opening 108 can be formed by etching through vertical stack 100, as shown in FIG. 1B. Further, opening 108 can be formed in a single etch through vertical stack 100, or in a series of etches through vertical stack 100, e.g., a first etch that removes a portion of oxide material 106 and a second, subsequent etch that removes a portion of silicon material 104.

Figure 1C:
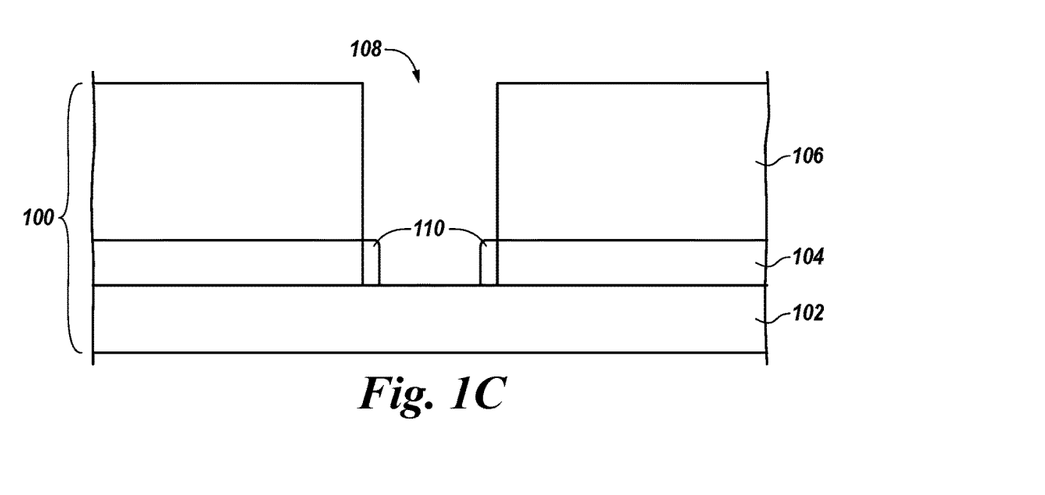

FIG. 1C illustrates a schematic cross-section view of the structure shown in FIG. 1B after a subsequent processing step. A metal material 110 is selectively formed, e.g., selectively deposited, in opening 108 adjacent silicon material 104 and on a portion of resistive memory material 102, as illustrated in FIG. 1C. Metal material 110 can be selectively formed in opening 108 adjacent silicon material 104 and on the portion of resistive memory material 102 using, for example, a selective atomic layer deposition (ALD) process.

Metal material 110 can be, for example, a copper material. However, embodiments of the present disclosure are not limited to a particular type of metal material, and can include any type of metal that can be selectively formed in opening 108 adjacent silicon material 104 and on the portion of resistive memory material 102.

As used herein, selectively forming metal material 110 in opening 108 can include forming metal material 110 in opening 108 such that metal material 110 does not form in opening 108 adjacent oxide material 106, e.g., such that metal material 110 is formed exclusively adjacent silicon material 104 and on a portion of resistive memory material 102, as illustrated in FIG. 1C. That is, metal material 110 adheres to silicon material 104, but not oxide material 106, such that opening 108 is the only location in which metal material 110 is formed, as illustrated in FIG. 1C.

Figure 1D:
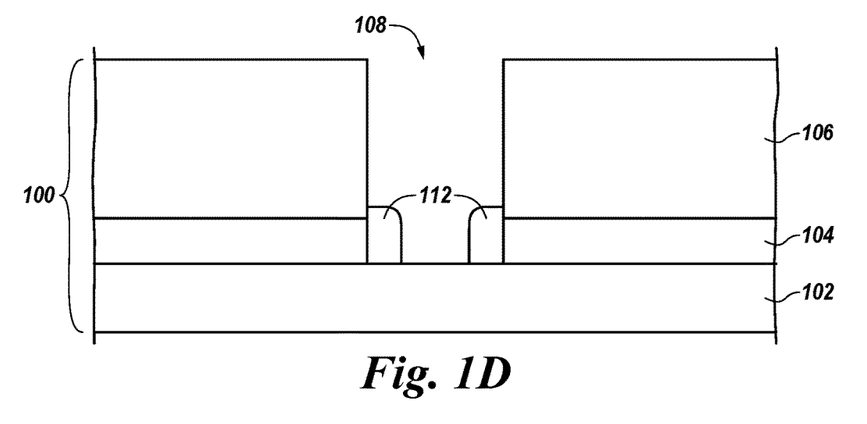

FIG. 1D illustrates a schematic cross-section view of the structure shown in FIG. 1C after a subsequent processing step. Metal material 110 is oxidized to form metal oxide, e.g., copper oxide (CuOx), material 112 in opening 108. Metal oxide material 112 may be annular shaped and may also be adjacent a portion of oxide material 106. That is, metal oxide material 112 may cover a portion, e.g., not all, of the bottom of opening 108, the sides of silicon material 104 that define the sidewalls of opening 108, and a portion, e.g., not all, of the sides of oxide material 106 that define the sidewalls of opening 108, as shown in FIG. 1D. Further, metal oxide material 112 does not completely fill the portion of opening 108 formed by the bottom of opening 108 and the sides of silicon material 104 that define the sidewalls of opening 108, as illustrated in FIG. 1D.

Metal oxide material 112 can confine, e.g., restrict, filament formation in the resistive memory cell to the area enclosed by the metal oxide material 112. For example, metal oxide material 112 can prevent a filament, e.g., conductive filament, from forming in the cell outside of the area enclosed by metal oxide material 112. The area enclosed by the metal oxide material 112 in which filament may form can include, for example, the unfilled portion of opening 108 formed by the bottom of opening 108 and the sides of silicon material 104 that define the sidewalls of opening 108.

Figure 1E:
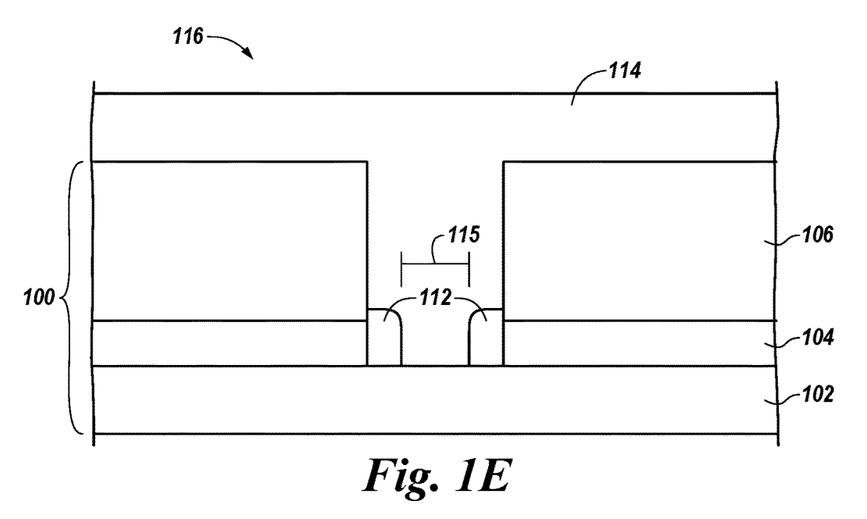

FIG. 1E illustrates a schematic cross-section view of the structure shown in FIG. 1D after a subsequent processing step. An ion source material 114 is formed in opening 108 and on oxide material 106. For example, ion source material 114 is formed in opening 108 adjacent oxide material 106 and metal oxide material 112, and on a portion of resistive memory material 102. Ion source material 114 can be formed in opening 108 and on oxide material 106 using, for example, a chemical vapor deposition (CVD) or ALD process.

As shown in FIG. 1E, ion source material 114 completely fills the area enclosed by metal oxide material 112. Additionally, ion source material 114 completely fills the portion of opening 108 formed by the sides of oxide material 106 that define the sidewalls of opening 108, as illustrated in FIG. 1E.

Ion source material 114 can be, for example, an ion source material for RRAM, such as copper telluride (CuTe) or silver sulfide ($Ag_2S$). However, embodiments of the present disclosure are not limited to a particular type of ion source material.

The structure illustrated in FIG. 1E can be a portion of a resistive memory cell, e.g., resistive memory cell 116. For example, resistive memory material 102 can be the storage element of resistive memory cell 116. Resistive memory cell 116 can be, for example, an RRAM cell.

The area enclosed by the metal oxide material 112 can have a width 115, e.g., diameter, of, for example, 5 to 15 nanometers. As such, the contact area between resistive memory material 102 and ion source material 114 can be smaller than in previous resistive memory cells. Accordingly, the area in resistive memory cell 116 in which filament may form can be smaller than in previous resistive memory cells. That is, metal oxide material 112 can confine filament formation in the resistive memory cell to a smaller area than in previous resistive memory cells because metal oxide material 112 can create a smaller contact area between resistive memory material 102 and ion source material 114 than in previous resistive memory cells. Accordingly, the resistive memory cell may have a higher switching uniformity and/or lower variability between other resistive memory cells than previous resistive memory cells, which can increase the performance, consistency, and/or reliability of the resistive memory cell.

Figure 2A:
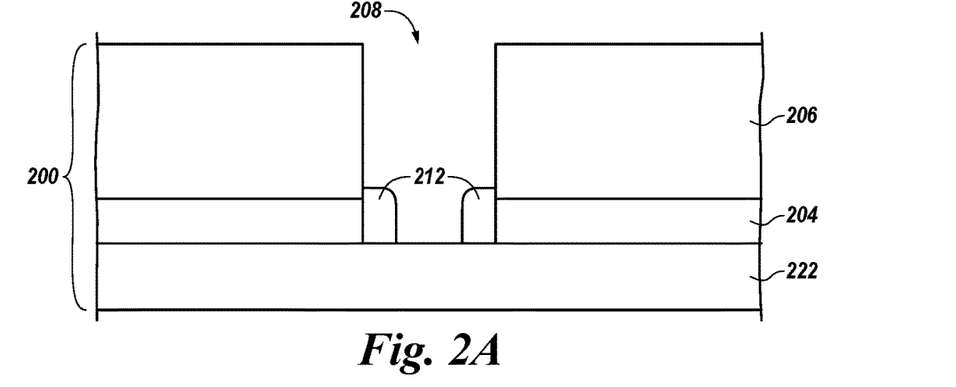
FIGS. 2A-2C illustrate process steps associated with forming a resistive memory cell in accordance with one or more embodiments of the present disclosure.
Figure 2B:
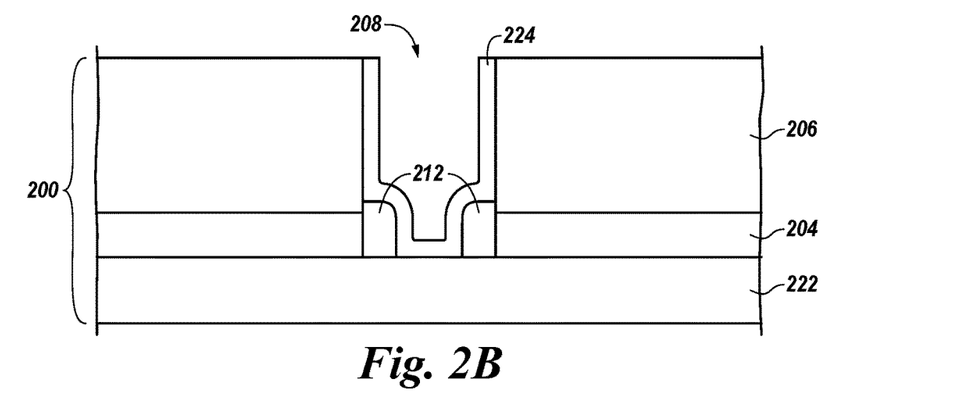
Figure 2C:
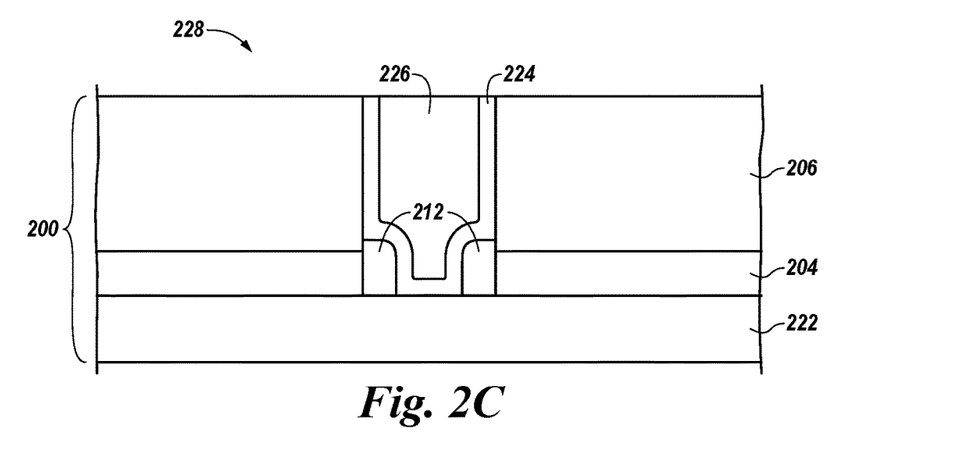

FIGS. 2A-2C illustrate process steps associated with forming a resistive memory cell in accordance with one or more embodiments of the present disclosure. The structure, e.g., vertical stack 200, illustrated in FIG. 2A can be analogous to the structure, e.g., vertical stack 100, illustrated in FIG. 1D, except that resistive memory material 102 has been replaced by an electrode 222. For example, vertical stack 200 includes a silicon material 204 analogous to silicon material 104 on electrode 222, an oxide material 206 analogous to oxide material 106 on silicon material 204, an opening 208 analogous to opening 108 formed in vertical stack 200, and a metal, e.g., copper, oxide material 212 analogous to metal, e.g., copper, oxide material 112 formed in opening 208.

Electrode 222 can be, for example, a metal such as tungsten or platinum, among other metals. However, embodiments of the present disclosure are not limited to a particular type of electrode.

FIG. 2B illustrates a schematic cross-section view of the structure shown in FIG. 2A after a subsequent processing step. A resistive memory material 224 is formed, e.g., deposited, in opening 208. For example, resistive memory material 224 is formed in opening 208 adjacent oxide material 206 and metal oxide material 212, and on a portion of electrode 222.

As shown in FIG. 2B, resistive memory material 224 does not completely fill the area enclosed by metal oxide material 212. Additionally, resistive memory material 224 does not completely fill the portion of opening 208 formed by the sides of oxide material 206 that define the sidewalls of opening 208, as illustrated in FIG. 2B.

Resistive memory material 224 can be, for example, $ZrO_2$ or $GdO_x$, or one of the other resistive memory, e.g., RRAM, materials previously described herein, e.g., in connection with FIG. 1A. However, embodiments of the present disclosure are not limited to a particular type of resistive memory material.

FIG. 2C illustrates a schematic cross-section view of the structure shown in FIG. 2B after a subsequent processing step. An ion source material 226 is formed in opening 208. For example, ion source material 226 is formed in opening 208 adjacent, between, and on resistive memory material 224. Ion source material 226 can be formed in opening 208 using, for example, a CVD or ALD process.

Ion source material 226 can be, for example, an ion source material for RRAM, such as CuTe or $Ag_2S$. However, embodiments of the present disclosure are not limited to a particular type of ion source material.

The structure illustrated in FIG. 2C can be a portion of a resistive memory cell, e.g., resistive memory cell 228. For example, resistive memory material 224 can be the storage element of resistive memory cell 228. Resistive memory cell 228 can be, for example, an RRAM cell.

Figure 3A:
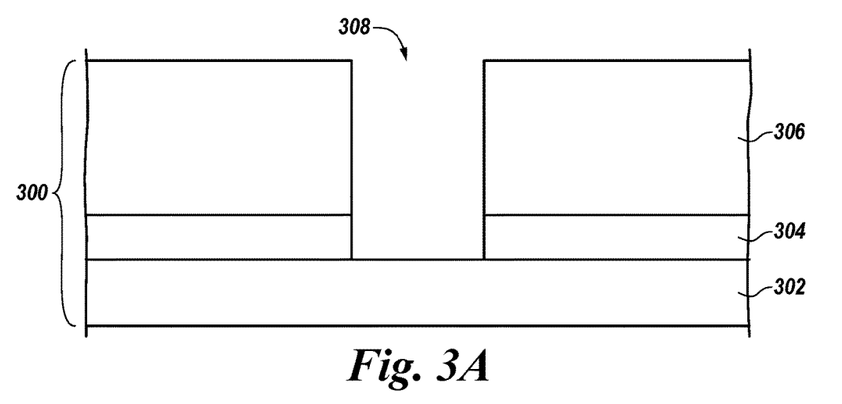
FIGS. 3A-3C illustrate process steps associated with forming a resistive memory cell in accordance with one or more embodiments of the present disclosure.
Figure 3B:
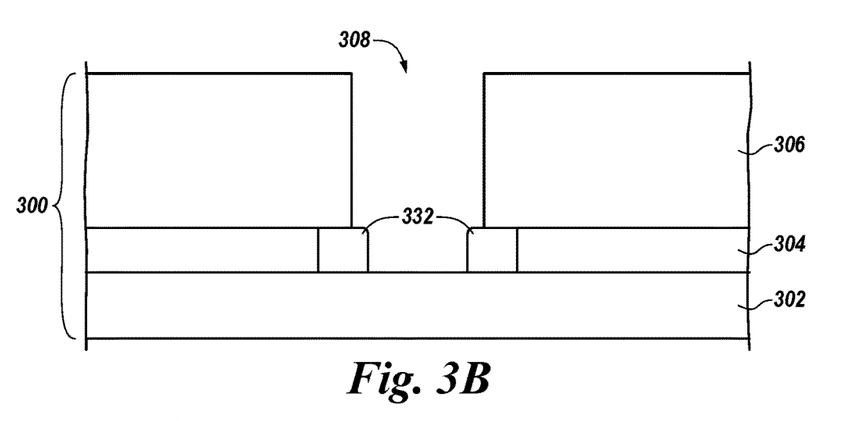
Figure 3C:
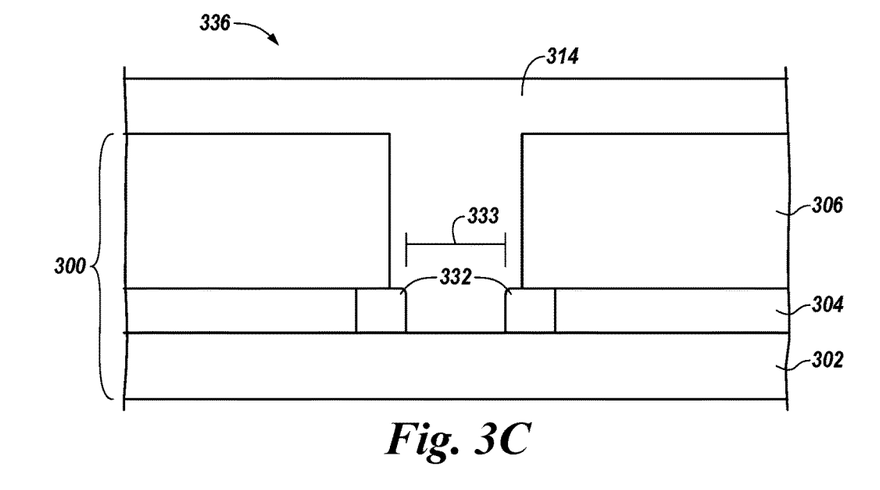

FIGS. 3A-3C illustrate process steps associated with forming a resistive memory cell in accordance with one or more embodiments of the present disclosure. The structure, e.g., vertical stack 300, illustrated in FIG. 3A can be analogous to the structure, e.g., vertical stack 100, illustrated in FIG. 1B. For example, vertical stack 300 includes a resistive memory material 302 analogous to resistive memory material 102, a silicon material 304 analogous to silicon material 104 on resistive memory material 302, an oxide material 306 analogous to oxide material 106 on silicon material 304, and an opening 308 analogous to opening 108 formed in vertical stack 300.

FIG. 3B illustrates a schematic cross-section view of the structure shown in FIG. 3A after a subsequent processing step. Silicon material 304 adjacent opening 308 is oxidized to form a silicon dioxide, e.g., $SiO_2$, material 332 in opening 308 adjacent silicon material 304 and on a portion of resistive memory material 302, as illustrated in FIG. 3B. The silicon dioxide material 332 may be annular shaped and may cover a portion, e.g., not all, of the bottom of opening 308, as shown in FIG. 3B. Further, the oxidation of silicon material 304, e.g., the formation of silicon dioxide material 322, may consume a portion of silicon material 304, e.g., the sides of silicon material 304 that define the sidewalls of opening 308, as illustrated in FIG. 3B. Additionally, silicon dioxide material 332 does not completely fill the portion of opening 308 formed by the bottom of opening 308 and the sides of silicon material 304 that defined the sidewalls of opening 308, as illustrated in FIG. 3B.

Silicon dioxide material 332 can confine filament formation in the resistive memory cell to the area enclosed by silicon dioxide material 332, e.g., the unfilled portion of opening 308 formed by the bottom of opening 308 and the sides of silicon material 304 that defined the sidewalls of opening 308, in a manner analogous to metal oxide material 112 previously described herein, e.g., in connection with FIG. 1D.

FIG. 3C illustrates a schematic cross-section view of the structure shown in FIG. 3B after a subsequent processing step. An ion source material 314 is formed in opening 308 and on oxide material 306, in a manner analogous to ion source material 114 being formed in opening 108 and on oxide material 106 as previously described herein, e.g., in connection with FIG. 1E.

As shown in FIG. 3C, ion source material 314 completely fills the area enclosed by silicon dioxide material 332. Additionally, ion source material 314 completely fills the portion of opening 308 formed by the sides of oxide material 306 that define the sidewalls of opening 308, as illustrated in FIG. 3C.

Ion source material 314 can be, for example, an ion source material for RRAM, such as CuTe or $Ag_2S$. However, embodiments of the present disclosure are not limited to a particular type of ion source material.

The structure illustrated in FIG. 3C can be a portion of a resistive memory cell, e.g., resistive memory cell 336. For example, resistive memory material 302 can be the storage element of resistive memory cell 336. Resistive memory cell 336 can be, for example, an RRAM cell.

The area enclosed by the silicon dioxide material 332 can have a width 333, e.g., diameter, of, for example, 5 to 15 nanometers. As such, the contact area between resistive memory material 302 and ion source material 314 can be smaller than in previous resistive memory cells. Accordingly, the area in resistive memory cell 336 in which filament may form can be smaller than in previous resistive memory cells, in a manner analogous to resistive memory cell 116 previously described herein, e.g., in connection with FIG. 1E. Accordingly, the resistive memory cell may have a higher switching uniformity and/or lower variability between other resistive memory cells than previous resistive memory cells, which can increase the performance, consistency, and/or reliability of the cell.

Figure 4A:
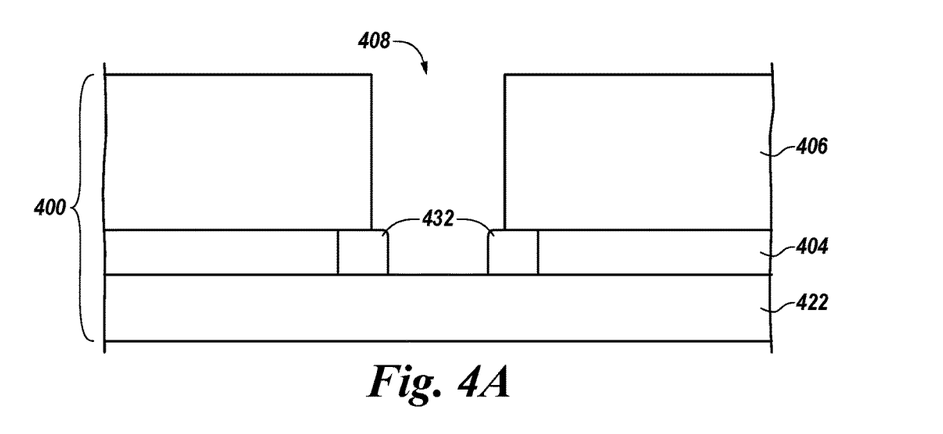
FIGS. 4A-4C illustrate process steps associated with forming a resistive memory cell in accordance with one or more embodiments of the present disclosure.
Figure 4B:
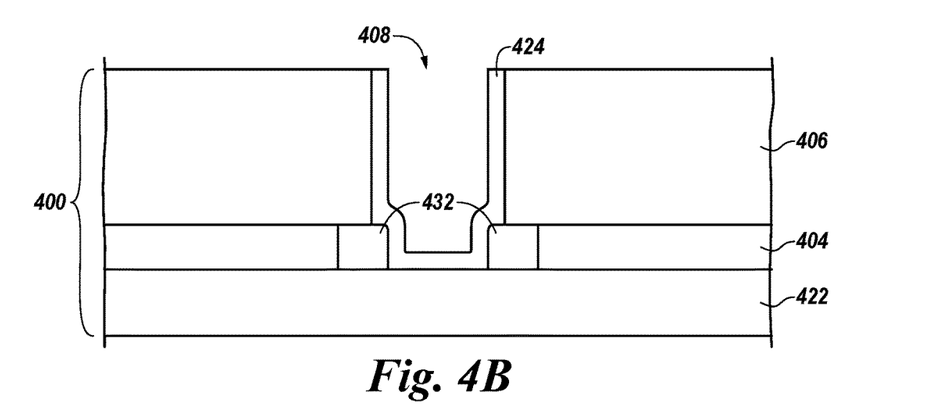
Figure 4C:
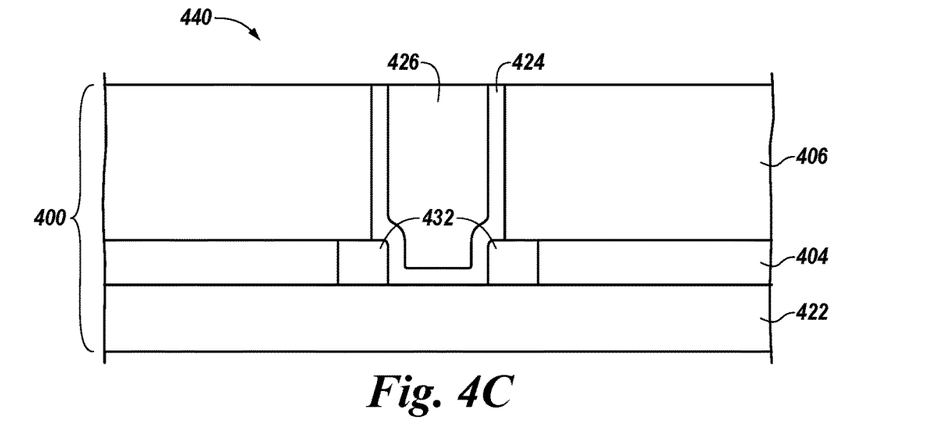

FIGS. 4A-4C illustrate process steps associated with forming a resistive memory cell in accordance with one or more embodiments of the present disclosure. The structure, e.g., vertical stack 400, illustrated in FIG. 4A can be analogous to the structure, e.g., vertical stack 300, illustrated in FIG. 3B, except that resistive memory material 302 has been replaced by an electrode 422. For example, vertical stack 400 includes a silicon material 404 analogous to silicon material 304 on electrode 422, an oxide material 406 analogous to oxide material 306 on silicon material 404, an opening 408 analogous to opening 308 formed in vertical stack 400, and a silicon dioxide material 432 analogous to silicon dioxide material 332 formed in opening 408.

Electrode 422 can be, for example, a metal such as tungsten or platinum, among other metals. However, embodiments of the present disclosure are not limited to a particular type of electrode.

FIG. 4B illustrates a schematic cross-section view of the structure shown in FIG. 4A after a subsequent processing step. A resistive memory material 424 is formed, e.g., deposited, in opening 408. For example, resistive memory material 424 is formed in opening 408 adjacent oxide material 406 and silicon dioxide material 432, and on a portion of electrode 422.

As shown in FIG. 4B, resistive memory material 424 does not completely fill the area enclosed by silicon dioxide material 432. Additionally, resistive memory material 424 does not completely fill the portion of opening 408 formed by the sides of oxide material 406 that define the sidewalls of opening 408, as illustrated in FIG. 4B.

Resistive memory material 424 can be, for example, $ZrO_2$ or $GdO_x$, or one of the other resistive memory, e.g., RRAM, materials previously described herein, e.g., in connection with FIG. 1A. However, embodiments of the present disclosure are not limited to a particular type of resistive memory material.

FIG. 4C illustrates a schematic cross-section view of the structure shown in FIG. 4B after a subsequent processing step. An ion source material 426 is formed in opening 408 in a manner analogous to ion source material 226 being formed in opening 208 previously described herein, e.g., in connection with FIG. 2C.

Ion source material 426 can be, for example, an ion source material for RRAM, such as CuTe or $Ag_2S$. However, embodiments of the present disclosure are not limited to a particular type of ion source material.

The structure illustrated in FIG. 4C can be a portion of a resistive memory cell, e.g., resistive memory cell 440. For example, resistive memory material 424 can be the storage element of resistive memory cell 440. Resistive memory cell 440 can be, for example, an RRAM cell.

CONCLUSION

Resistive memory having confined filament formation is described herein. One or more method embodiments include forming an opening in a stack having a silicon material and an oxide material on the silicon material, and forming an oxide material in the opening adjacent the silicon material, wherein the oxide material formed in the opening confines filament formation in the resistive memory cell to an area enclosed by the oxide material formed in the opening.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method of processing a resistive memory cell, comprising:
    forming a stack having a silicon material and a first oxide material on the silicon material;
    forming an opening in the stack;
    forming a second oxide material in a portion of the opening in the stack adjacent the silicon material by oxidizing the silicon material adjacent the portion of the opening in the stack such that a portion of the silicon material is consumed; and
    forming an ion source material in the opening in the stack directly contacting respective sidewalls of the first oxide material and the second oxide material.

2. The method of claim 1, wherein the portion of the silicon material that is consumed comprises sides of the silicon material that define sidewalls of the opening in the stack.

3. The method of claim 1, wherein the stack further includes a resistive memory material on which the silicon material is formed.

4. The method of claim 1, wherein the second oxide material is formed in the opening in the stack such that the second oxide material does not completely fill the opening in the stack.

5. The method of claim 1, wherein the ion source material is copper telluride.

6. The method of claim 1, wherein the ion source material is silver sulfide.

7. The method of claim 1, wherein the method includes forming the second oxide material in a lower portion of the opening in the stack adjacent the silicon material.

8. A method of processing a resistive memory cell, comprising:
    forming a stack having an electrode, a silicon material on the electrode, and a first oxide material on the silicon material;
    forming an opening in the stack;
    forming a second oxide material in a portion of the opening in the stack adjacent the silicon material and on the electrode; and
    forming a resistive memory material in the opening in the stack directly contacting respective sidewalls of the first oxide material and the second oxide material.

9. The method of claim 8, wherein the method includes forming an ion source material in the opening in the stack adjacent, between, and on the resistive memory material.

10. The method of claim 8, wherein the resistive memory material is formed in the opening in the stack such that the resistive memory material does not completely fill the opening in the stack.

11. The method of claim 8, wherein the method includes forming the second oxide material in the opening in the stack by:
    selectively forming a metal material in the opening in the stack adjacent the silicon material and on a portion of the electrode; and
    oxidizing the metal material to form a metal oxide material in the opening in the stack adjacent the silicon material and on the electrode.

12. The method of claim 8, wherein the method includes forming the second oxide material in the opening in the stack by oxidizing the silicon material adjacent the opening in the stack such that a portion of the silicon material is consumed and a silicon dioxide material is formed in the opening in the stack adjacent the silicon material and on the electrode.

13. The method of claim 8, wherein the method includes forming the second oxide material in the opening in the stack such that the second oxide material does not form adjacent an upper sidewall of the first oxide material.

14. A resistive memory cell, comprising:
    a vertical stack having:
        an electrode;
        a silicon material on and directly contacting the electrode;
        a first oxide material on the silicon material;
        a second oxide material formed on a sidewall of the silicon material; and
        a resistive memory material directly contacting opposing sidewalls of the first oxide material and opposing sidewalls of the second oxide material in an area enclosed by the second oxide material.

15. The resistive memory cell of claim 14, wherein the resistive memory material does not completely fill the area enclosed by the second oxide material.

16. The resistive memory cell of claim 14, wherein the area enclosed by the second oxide material has a width of 5 to 15 nanometers.

17. The resistive memory cell of claim 14, wherein the second oxide material is a metal oxide material.

18. The resistive memory cell of claim 14, wherein the second oxide material is a silicon dioxide material.

19. The resistive memory cell of claim 14, wherein the second oxide material is on and directly contacting the electrode.

* * * * *